(12) United States Patent
Deppe et al.

(10) Patent No.: US 8,774,246 B1
(45) Date of Patent: Jul. 8, 2014

(54) SEMICONDUCTOR LIGHT SOURCES INCLUDING SELECTIVE DIFFUSION FOR OPTICAL AND ELECTRICAL CONFINEMENT

(75) Inventors: Dennis G. Deppe, Oviedo, FL (US); Sabine M. Freisem, Orlando, FL (US)

(73) Assignees: University of Central Florida Research Foundation, Inc., Orlando, FL (US); sdPhotonics, LLC, Oviedo, FL (US)

( * ) Notice: Subject to any disclaimer, the term of this patent is extended or adjusted under 35 U.S.C. 154(b) by 127 days.

(21) Appl. No.: 13/352,050

(22) Filed: Jan. 17, 2012

Related U.S. Application Data (60) Provisional application No. 61/432,938, filed on Jan. 14, 2011.

(51) Int. Cl.
*H01S 5/183* (2006.01)
*H01S 5/187* (2006.01)

(52) U.S. Cl.
USPC ............. 372/50.124; 372/45.01; 372/46.01; 372/46.015; 372/50.123; 372/70

(58) Field of Classification Search
USPC ............. 372/45.01, 46.01, 46.015, 50.123, 372/50.124, 70
See application file for complete search history.

(56) References Cited

U.S. PATENT DOCUMENTS

| | | | |
|---|---|---|---|
| 5,226,053 A | 7/1993 | Cho et al. | |
| 2001/0043636 A1 * | 11/2001 | Bewley et al. | 372/70 |
| 2002/0110196 A1 * | 8/2002 | Nguyen et al. | 375/240.22 |
| 2002/0191656 A1 * | 12/2002 | Mawst et al. | 372/43 |
| 2005/0063440 A1 | 3/2005 | Deppe | |
| 2005/0249254 A1 | 11/2005 | Deppe | |
| 2010/0265976 A1 * | 10/2010 | Bousquet et al. | 372/44.01 |
| 2010/0272145 A1 * | 10/2010 | Weichmann et al. | 372/75 |

FOREIGN PATENT DOCUMENTS

WO WO/9750109 * 12/1997

* cited by examiner

*Primary Examiner* — Jessica Stultz
*Assistant Examiner* — Michael Carter
(74) *Attorney, Agent, or Firm* — Jetter & Associates, P.A.

(57) ABSTRACT

A semiconductor vertical resonant cavity light source includes an upper mirror and a lower minor that define a vertical resonant cavity. A first active region is within the vertical resonant cavity for light generation between the upper minor and lower mirror. The vertical resonant cavity includes an inner mode confinement region and an outer current blocking region. A depleted heterojunction current blocking region (DHCBR) is within the outer current blocking region of at least one of the upper minor, lower minor, and first active region. A conducting channel within the inner mode confinement region is framed by the DHCBR. The DHCBR forces current flow into the conducting channel during operation of the light source.

8 Claims, 8 Drawing Sheets

Light Source (100)

SEMICONDUCTOR LIGHT SOURCES INCLUDING SELECTIVE DIFFUSION FOR OPTICAL AND ELECTRICAL CONFINEMENT

CROSS REFERENCE TO RELATED APPLICATIONS

This application claims the benefit of Provisional Application Ser. No. 61/432,938 entitled "SEMICONDUCTOR LIGHT SOURCES INCLUDING DEPLETED HETEROSTRUCTURES FOR OPTICAL AND ELECTRICAL CONFINEMENT", filed Jan. 14, 2011, which is herein incorporated by reference in its entirety.

GOVERNMENT INTERESTS

The United States Government has rights in this invention pursuant to Department of Defense (DOD) funding agency, the AFRL, under Phase II SBIR Contract No. FA8650-08-C-1418.

FIELD

Disclosed embodiments relate to semiconductor vertical cavity diode light sources that include structures for optical and electrical confinement, and to vertical cavity diode light sources used to excite lateral cavity and vertical cavity light sources integrated with the vertical cavities.

BACKGROUND

Semiconductor vertical cavity devices operate by emitting light in the normal direction to an epitaxial growth surface. In such a device a partial or complete cavity is formed on the same semiconductor substrate that includes the active light emitter. Semiconductor vertical cavity devices include vertical-cavity surface-emitting laser (VCSEL) diodes and resonant cavity light emitting diodes (RCLEDs).

A VCSEL is a laser resonator that includes two minors that are typically distributed Bragg reflector (DBR) mirrors that have layers with interfaces oriented substantially parallel to the die or wafer surface with an active region including of one or more bulk layers, quantum wells, quantum wires, or quantum dots for the laser light generation in between. The planar DBR-mirrors comprise layers with alternating high and low refractive indices. Each layer has a thickness of a quarter of the laser wavelength in the material, yielding intensity reflectivities that may be above 99%.

RCLED's are described in U.S. Pat. No. 5,226,053. A RCLED is a light emitting diode that generates mainly spontaneous emission and generally operates without a distinct threshold. The drive voltage of a spontaneous emitter can be less than its photon energy divided by the electron charge, under which condition it ideally absorbs heat in its light emission process. The RCLED's drive voltage can also exceed its photon energy, under which it generally generates heat in its light emission.

A laser typically generates heat in its light emission process since its quasi-Fermi energy separation for electrons and holes exceeds its emitted photon energy. A laser also generates some heat when electrons and holes absorb some of the laser light but remain respectively in the conduction band or valence band, known as free carrier absorption. In this case, some of the laser light is absorbed, and this internal absorption also reduces the laser light output. A laser also generates some heat if electrical currents are used to transport electrons and holes to an active region with an external electrical bias. These voltage losses that come from the electron and hole charge transport and the optical absorption that comes from the electron and hole free carrier absorption decrease the laser's efficiency and increase its self-heating. The optical absorption increases the laser's threshold which further decreases its efficiency.

Because the light is most efficiently extracted from a vertical cavity diode's surface in the same region in which electrical current is injected into its active area, a particular problem in semiconductor vertical cavity emitting diodes is the efficient lateral confinement of their electrical current to the same region that confines the optical mode. Known approaches to this problem include the standard intra-cavity oxide approach that suffers from mechanical strain, increases the vertical cavity diode's drive voltage, and blocks heat flow inside the vertical cavity diode. What is needed is new lateral electrical confinement structures for vertical cavity semiconductor light sources to confine the optical mode to regions that also receive electrical injection, that can produce high efficiency electrical injection into the same region as the optical mode, and can be fabricated with a high reproducibility across a wafer and from wafer to wafer, that moreover provides minimized mechanical strain and lateral size variation due to external process parameters.

SUMMARY

Disclosed embodiments are directed towards semiconductor light sources comprising at least one vertical resonant cavity light source, such as a VCSEL or RCLED, that may include selective buried acceptor or donor diffusions that control the electric conductivity in and around intracavity epitaxial phase-shifting layer or multiple layers to laterally confine one or more optical modes. The selective buried diffusions provide an electrical conductivity change in the surrounding layers to direct current flow through the inner mode confining region. Disclosed semiconductor light sources thus provide a new structure that provides both current blocking and mode confinement.

Some embodiments include at least one depleted heterojunction current blocking region (DHCBR) within an outer current blocking region of at least one of the upper minor, lower mirror, and the active region. A conducting channel is within the inner mode confinement region that is framed by the DHCBR, wherein the DHCBR functions to force current flow into the conducting channel 131 during operation of the light source.

A DHCBR is defined herein to comprise first and second materials, where the respective materials are different materials (e.g., GaAs and AlGaAs) interfaced with one another to form a heterojunction. The doping in the first and second materials may be the same, or the doping in the second material may be less than the doping in the first material. The first material being interfaced to the second material in the heterojunction depletes the mobile charge carriers of the second material to form a highly resistive region in the second material, so that the second material has no more than about $1\times10^{17}$ cm$^{-3}$ mobile charge carriers due to dopants. As such, the second material in the heterojunction is referred to herein as a depletable second material since it depletes in mobile charge concentration, such as from a concentration of about $10^{17}$ cm$^{-3}$ when in isolation, to a concentration of about $10^{8}$ cm$^{-3}$ to about $10^{15}$ cm$^{-3}$ when in the heterojunction interfaced to the first material.

A range of heterojunction materials and doping concentrations can be used to produce disclosed DHCBRs. An important DHCBR aspect is that the DHCBR possesses an electrical resistance that is sufficiently high to prevent leakage currents around an active region. It is useful to characterize the electrical resistance in terms of a contact resistance normalized to a blocking area, in units of ohms·cm$^2$. In some embodiments it is desirable that the DHCBR also have low capacitance to enable high speed modulation of the light source.

In embodiments where the depletable second material does not receive any impurity doping during fabrication, the mobile charge carrier concentration in the second region when in the heterojunction can be $\leq 1 \times 10^{12}$ cm$^{-3}$, to as low as $10^8$ cm$^{-3}$. In one specific example, an undoped $Al_{0.45}Ga_{0.55}As$ layer (depletable second material) is sandwiched between a moderately p-type (e.g., $1 \times 10^{17}$ cm$^{-3}$) doped $Al_{0.1}Ga_{0.9}As$ layer and an upper p+ (e.g., $3 \times 10^{19}$ cm$^{-3}$) GaAs layer. Although there is no p-n junction blocking, the $Al_{0.45}Ga_{0.55}As$ second material forms a DHCBR that is an electrical insulator (dielectric) in this configuration. Because the undoped (or lightly doped) layer of second material can be made quite thick, its capacitance can also be decreased. The depleted heterojunction can affect 0.2 μm or more in thickness (depletion region width) in the second material. Disclosed DHCBR's may include more than one heterojunction to increase its thickness and/or its electrical resistance.

Advantages of disclosed light sources include the electrical mode confining regions being self-aligned and lithographically defined to the optical mode confining regions, for example so that it can be portioned into closely spaced mesas of same or differing sizes in order to control the transverse modal behavior of the vertical resonant cavity light source. Additional advantages are also that the light sources can be driven with low voltage drive, with low thermal resistance, and without internal mechanical strain, except that which may be caused by electrical biasing. In this way very small vertical resonant cavity light sources (e.g., VCSELs or RCLEDs) can be formed that operate at low voltages, as well as those with dense arrays of emitting regions or with optical mode profiles and/or electrical injection that varies laterally within a device.

Disclosed embodiments are also directed to compound semiconductor light sources comprising at least a first vertical resonant cavity light source used to drive a second light source within the vertical cavity, where the second light source provides the emission for the compound light source. Disclosed semiconductor light sources thus can remove heat generating electrons and holes from the second light source that originate from the presence of dopants, by eliminating or reducing the concentration of its dopants.

In disclosed vertical cavity embodiments minors may also represent optical coupling regions that provide low reflectivity. In some cases the mirrors or optical coupling regions may be specially prepared surfaces with texture to improve output coupling.

DETAILED DESCRIPTION

Disclosed embodiments in this Disclosure are described with reference to the attached figures, wherein like reference numerals are used throughout the figures to designate similar or equivalent elements. The figures are not drawn to scale and they are provided merely to illustrate the disclosed embodiments. Several aspects are described below with reference to example applications for illustration. It should be understood that numerous specific details, relationships, and methods are set forth to provide a full understanding of the disclosed embodiments. One having ordinary skill in the relevant art, however, will readily recognize that the subject matter disclosed herein can be practiced without one or more of the specific details or with other methods. In other instances, well-known structures or operations are not shown in detail to avoid obscuring structures or operations that are not well-known. This Disclosure is not limited by the illustrated ordering of acts or events, as some acts may occur in different orders and/or concurrently with other acts or events. Furthermore, not all illustrated acts or events are required to implement a methodology in accordance with this Disclosure.

Notwithstanding that the numerical ranges and parameters setting forth the broad scope of this Disclosure are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5.

Disclosed embodiments include small semiconductor light sources including diode lasers and arrays of such lasers based on selective (non-blanket) buried acceptor (p-type) diffusions or selective donor (n-type) diffusions that simultaneously provide both the electrical injection path into the laser and optical mode confinement. An optical mode confining phase shift may also be included in an otherwise planar resonant cavity. In one embodiment each acceptor or donor diffusion provides a conducting channel that defines the mode confinement area of a small resonant cavity light emitting diode, or a VCSEL. Disclosed arrangements can reduce the operating current or voltage and control the optical mode for improved sensors, data communication, high power light sources for optical pumping or materials processing, as well as other applications.

In some embodiments a DHCBR is formed within an outer current blocking region of at least one of an upper minor, a lower minor, and the first active region that frames a conducting channel of the light source. The DHCBR forces current flow into the inner mode confinement region during operation of disclosed light sources. A selective dopant diffusion can also be performed in the inner mode confinement region to form a conducting channel laterally inside the DHCBR to further reduce electrical resistance into inner mode confinement region. The dopant diffusion can be either an acceptor diffusion or a donor diffusion.

In other embodiments, an acceptor diffusion can be performed through an active layer into a region vertically adjoining the active layer that contains differing material compositions containing donor dopants. These differing material compositions can be such that the acceptor diffusion incorporates to a greater degree into one of the material compositions to change its electrical conductivity by producing an acceptor concentration that exceeds the donor concentration, while incorporation into the differing material composition to a lesser degree to maintain an acceptor concentration that is less than the donor concentration. In this manner a conductivity change can be obtained between the differing material compositions vertically adjoining the active layer, and thus impede the current flow. Thus the acceptor diffusion can form a buried acceptor diffusion, in which the acceptor passes through one material composition to incorporate mainly in a second and differing material composition. It is also possible that the acceptor concentration exceeds the donor concentration in a material with lower incorporation, but forms a DHCBR after diffusion due to heterojunctions and the respective material compositions.

When an acceptor diffusion is performed through an active layer it can also modify the active layer composition, causing intermixing between the active layer and surrounding materials. This intermixing with surrounding materials can further provide mode and electrical confinement, by changing the active material composition and thus its emission energy and refractive index.

In some embodiments, mesas are included. Mesas are known in the art as being structures that provide a step height which can improve current confinement, mode confinement (e.g., to provide single mode operation), and also reduce the threshold current for lasing. Fabrication methods are also disclosed herein that include using material beneath mesas initially not doped with dopant impurities to create a conductivity type different than the mesa and the semiconductor material above the mesa. Diffusion of dopant impurities from the mesa into the semiconductor material below the mesa can convert the semiconductor material immediately below to the same type as the mesa, while regions outside and below the mesa can remain substantially free of dopants. In this way a DHCBR can be formed outside the mesa to provide a high resistance region while the mesa region itself and the layer immediately below the mesa can provide low electrical resistance. Thus, electrical current may be forced to flow mainly through the mesa in the inner mode confinement region, so that efficient electrical injection is made into the same region that confines the optical mode.

Figure 1A:
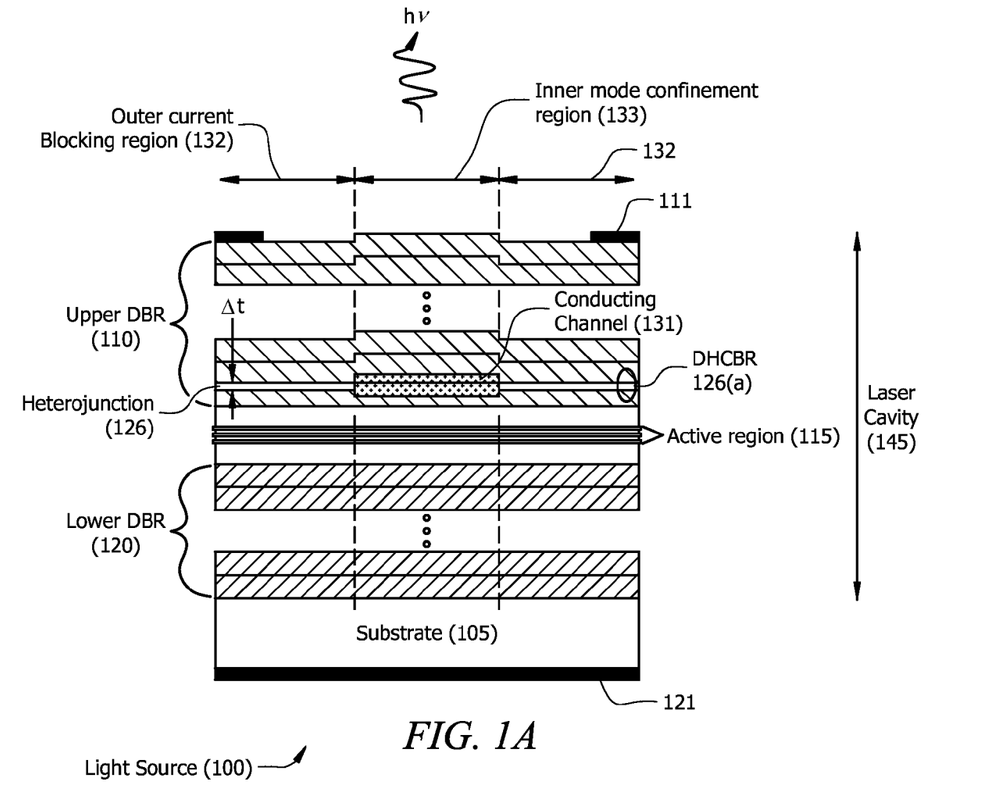
FIG. 1A is a schematic cross sectional diagram of a semiconductor vertical cavity diode light source that includes a selective diffusion that provides a conducting channel through an otherwise current blocking layer provided by a DHCBR which provides both optical and electrical confinement in an upper minor region of the laser cavity, according to an example embodiment.

FIG. 1A is a schematic cross sectional diagram of a semiconductor vertical cavity diode light source 100 that includes a selective diffusion which provides a conducting channel 131 through an otherwise current blocking layer provided by a DHCBR 126(*a*) in an upper minor shown as upper DBR 110 of the laser cavity 145, according to an example embodiment. Upper DBR 110 may also be replaced with other minor schemes, such as combined with dielectric or metal layers. It may also include an optical coupling element. Although light source 100 is shown as top emitting, disclosed light sources can be also side emitting or bottom emitting. In the embodiment described relative to FIG. 1A, the substrate 105 can be an n-GaAs or an n+ GaAs substrate. Other substrates and epitaxial materials can be used, such as InP, GaN, sapphire, GaP, InAs, Si, Ge, which are all commonly used to form semiconductor light emitters.

Although a substrate 105 is shown in FIG. 1A and other FIGs. herein, in some process flows the substrate 105 is removed at or near the end of processing, so that the light source 100 only includes the epitaxial layers that form the light source, with no supporting substrate. In this process flow the light source is generally transferred to another substrate. For example, a substrate-less light source may be transferred to a silicon substrate for integration with silicon-based electronics, so that the epi film of the laser can be grown on its matching substrate (e.g., GaAs), since it may not be able to be grown on a silicon substrate due to epitaxial incompatibility. It may also be inserted into a display.

Light source 100 includes an inner mode confinement region 133 and an outer current blocking region 132. As described below, a disclosed selective diffusion forms the conducting channel 131 shown as part of the inner mode confinement region 133.

The upper DBR 110 includes an electrical contact 111, such as an acceptor (p) doped P+ contact. Light source 100 also includes a lower mirror shown as lower DBR 120, such as donor (n) doped having an electrical contact 121 such as an N+ contact. The DBRs 110, 120 each generally include 10 to 30 periods, such as 18-25 periods for the lower DBR 120 and 15 to 20 periods for the upper DBR 110. In one specific embodiment, upper DBR 110 can comprise p-AlGaAs/GaAs stacks, while the lower DBR 120 can comprise n-AlGaAs/GaAs stacks. The light source 100 is formed in at least two epitaxial growth steps. Lower DBR can also be replaced with output coupling layers, or a minor approaching zero reflectivity.

The upper DBR 110 and lower DBR 120 can each comprise fully semiconductor DBRs, or comprise partial DBRs with added metal or dielectric layers that provide added reflectivity. In the case of added metal or dielectric layers the layer thicknesses can be chosen to obtain the needed interference in the emitted light such that the desired reflectivity is achieved. These thicknesses depend on the specific material parameters as known in the art.

An active region 115 is positioned between the respective DBR's 110 and 120. The active region 115 can comprise at least one bulk layer, quantum well (QW) layer, quantum wire layer, or quantum dot layer. An example QW layer comprises InGaAs formed between adjoining GaAs layers. More than one layer may make up active region 115, such as multiple QW layers, bulk layers, quantum dot layers, quantum wire layers, and combinations thereof.

One of the layer stack heterojunctions (i.e., junctions between two materials with different band gaps, e.g., AlGaAs/GaAs stacks) in the upper DBR 110 is shown as heterojunction 126. Heterojunction 126 includes DHCBR 126(a) within its outer current blocking region 132 and a conducting channel 131 in its inner mode confinement region 133. DHCBR 126(a) provides both optical mode and electrical confinement.

Conducting channel 131 can include acceptor doping in the range from about $5 \times 10^{17}$ cm$^{-3}$ to about $1 \times 10^{20}$ cm$^{-3}$, while the DHCBR 126(a) lateral to the conducting channel 131 has a doping level on its more lightly doped side that may be the same, or be significantly below, that of conducting channel 131 to provide lateral electrical confinement, such as a maximum acceptor doping of $1 \times 10^{17}$ cm$^{-3}$, maximum doping of $5 \times 10^{16}$ cm$^{-3}$, maximum doping of $1 \times 10^{16}$ cm$^{-3}$, such as a maximum doping of $1 \times 10^{15}$ cm$^{-3}$, including an even lower doping level when intentionally not doped during fabrication. For example, intentional doping may be eliminated from the more lightly doped side of the DHCBR 126(a), so that it contains only background impurity concentrations due to the epitaxial growth, often less than $\sim 10^{15}$ cm$^{-3}$, such as doping in the range from $1 \times 10^{10}$ cm$^{-3}$ to $1 \times 10^{15}$ cm$^{-3}$. The depletable material side of DHCBR 126(a) has a voltage dependent depletion region thickness in the vertical direction shown as $\Delta t$.

The current blocking ability of the DHCBR 126(a) can be described by the contact resistance it creates, given in the units of ohm·cm$^2$ ('Ω·cm$^2$'). This contact resistance is given approximately by the equation below in terms of the depletion layer thickness, hole concentration in the depleted layer, $p_{SH-CBR}$, and hole mobility, $\mu_h$, as $$\rho_{DHCBR} = \frac{\Delta t}{q \mu_h p_{DHCBR}} \quad (1)$$

where q is the electronic charge. The hole concentration in the depleted layer is set by the valence band discontinuity as well as the doping levels. As an example, a DHCBR formed from undoped AlAs with $\Delta t = 850$ Å clad by p-type GaAs with the GaAs acceptor doped to $10^{18}$ cm$^{-3}$, could yield a hole concentration in the AlAs as low as $2 \times 10^9$ cm$^{-3}$. The corresponding contact resistance of the DHCBR 126(a) will be approximately 200 'Ω·cm$^2$'. Even a 1 V drop across the DHCBR would produce only ~0.005 A/cm$^2$ leakage current density around the active device. A 250 μm×250 μm light source 100 embodied as a VCSEL chip would produce ~3 μA of leakage current, which is negligible. Etching can also be used to further restrict the device area that includes the DHCBR 126(a), to achieve low capacitance or dense packing in arrays, and eliminate leakage currents through the DHCBR relative to the active region current in conducting channel 131.

Lithography applied to inner mode confinement region 133 after an initial epitaxial growth step can be used to define selective doping in conducting channel 131, and thus very small size devices since the device area is generally only limited by the resolution of the lithography tool (e.g., ≤50 nm). This lithography step and semiconductor surface processing through etching can be used to remove some of the semiconductor material in outer current blocking regions 132 in a given layer (or layers) to enable the conducting channel 131 to be in the form of the mesa structure shown. The mesa structure can occur anywhere in the upper DBR 110. To achieve the minimum threshold for a given device size however it can be an advantage if the conducting channel 131 is placed within two optical wavelengths (free space wavelength divided by $n_r$ in the crystal) distance to the active region 115, and for the mesa to be between 5 Å to 300 Å in height, with the optical wavelength relative to that in the semiconductor material. An acceptor-diffusion from the remaining semiconductor material in the conducting channel 131 not removed using lithography can then be performed, including in the epitaxial growth apparatus. If the diffusion is performed outside the growth chamber, after diffusion the semiconductor surface can then be cleaned and the wafer placed back in the semiconductor epitaxial growth apparatus to form subsequent epi layers to complete the upper DBR 110.

The diffusion from the remaining crystal region can be performed in the epitaxial growth apparatus. Thus, conducting channel 131 can provide a mesa including an acceptor diffusion level (or donor diffusion level) sufficient to provide the conducting channel 131 in inner mode confinement region 133 through an otherwise current blocking layer heterojunction 126.

Figure 1B:
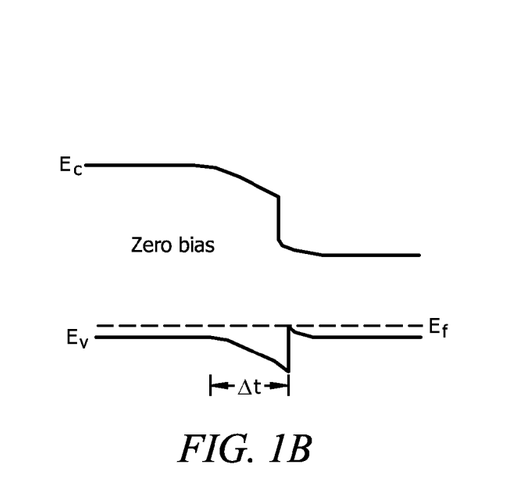
FIGS. 1B and 1C are band diagrams depicting the shape of energy bands of a DHCBR 126(a) lateral to the conducting channel of the light source shown in FIG. 1A under zero bias and a forward bias, respectively.
Figure 1C:
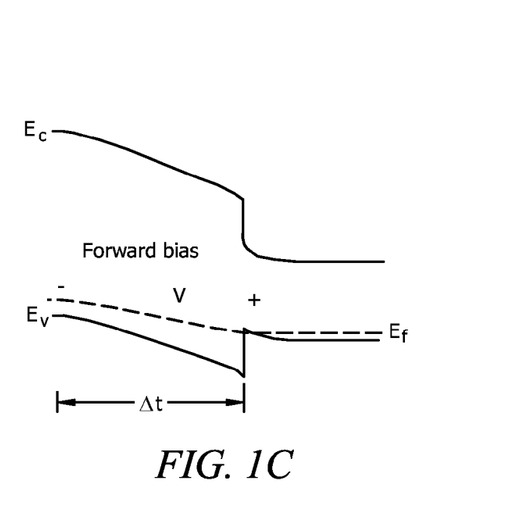

The band diagrams shown in FIGS. 1B and 1C depict the DHCBR 126(a) shown in FIG. 1A under zero bias and a forward bias, respectively. The width of the depletion region $\Delta t$ in DHCBR 126(a) can be seen to increase with a forward bias voltage applied (forward bias applied between contacts 111 and 121) which serves to further block the current flow across the DHCBR 126(a) and thus direct the current to the conducting channel 131. If two heterojunctions are used, the depletion width may remain fixed with applied bias.

Although the conducting channel 131 is provided by an acceptor diffusion as described relative to FIG. 1A, as noted above, the conducting channel 131 can also be formed n doped by using an donor impurity (n-type) diffusion instead of acceptor impurity diffusion. In this arrangement the depleted heterojunction 126 is also embedded in n-type material to form the outer current blocking region 132.

Considering the contact resistance for the p-conducting channel with thickness $\Delta t$, it can given approximately by $$\rho_{Channel} = \frac{\Delta t}{q \mu_h p_{Channel}} \quad (2)$$

where now $p_{channel}$ is the hole concentration in the conducting channel. Considering an acceptor diffusion, the hole concentration in the conducting channel may be $10^{17}$ cm$^{-3}$. The contact resistance of the conducting channel could be less than $5 \times 10^{-6}$ 'Ω·cm$^2$', more than 8 orders of magnitude less than for some DHCBR designs. Even for a high current density excitation of $10^4$ A/cm$^2$, the voltage drop over the conducting channel would be only ~50 mV.

The conducting channel however can also suffer increased contact resistance due to heterojunction effects. In addition, the hole concentration in the conducting channel formed by acceptor diffusion will in general depend on the incorporation of acceptor impurity in the conducting channel materials.

Therefore the particular material compositions making up the DBCBR can be selected based on a desire to achieve both a current blocking characteristic in cavity region 132 and a conductivity level in the conducting channel 131 for low voltage drive in cavity region 133. Higher hole concentrations can decrease the voltage drop over the conducting channel 131 to a few mV.

A significant aspect of the DHCBR is that its improved temperature properties in the VCSEL can be used to make improved optical data links. The optical link generally includes a housing for electronic circuitry that receives data in electrical form and conditions the electrical signals to drive DHCBR comprising VCSELs that produce the optical data signals. This housing increases in temperature during operation of the optical link, which increases the temperature of operation of the VCSELs. The speed with which optical data can be transmitted by the link through an optical medium such as an optical fiber, waveguide, or free space, and received by photodiodes and additional electronic circuitry, that converts the optical data back to electrical data, may largely be set by the temperature performance and speed of the VCSELs. Transceivers place the transmitting and receiving electronics and photonics components in a common housing, and allow both sending and receiving data by electronic circuitry, VCSELs, and photodiodes contained in a single housing. If the optical medium is optical fiber, and the fiber permanently fastened to the housing contains the interface electronics, VCSELs and photodiodes, the complete system can form an active optical cable. By using DHCBR comprising VCSELs, the optical links including active optical cable can be made to operate over a wider temperature range, and/or with higher speed, and with greater reliability. These advantages are important for applications, for example, in which large numbers of transceivers are used in close proximity and cause heating, consumer products based on active optical cables that may have small housings to conserve space, and optical data links used in space and satellite communications.

The thickness (t) of the DHCBR can range from ~10 nm to more than 0.2 µm. By increasing the thickness the capacitance of disclosed light sources, such as a VCSEL, can be reduced. At the same time the capacitance is reduced, the electrical and thermal resistances can remain low because of the all-epitaxial structure. An example of a low electrical resistance of a conducting channel in a DHCBR is given below with the data shown in FIG. 6.

The DHCBR can also be used to make very small area light sources such as VCSELs and RCLEDs. This is because the conducting channel is formed lithographically, which also forms the lateral cavity of the device. Therefore the conducting channel 131 can be as small as 100 nm in diameter, or smaller based on the available lithographic tool. This provides the opportunity to make very small sized VCSELs and RCLEDs for dense integration into various systems, increasing the system's capabilities. The very small sized VCSELs can be used to transmit high speed optical data signals. The small sizes are particularly useful for integrating onto Si photonic chips, since the small sized VCSELs can couple their outputs to Si photonic waveguides. The small sized VCSELs are also important for improved sensors, since reducing their cavity size can improve their single mode properties.

Small RCLEDs or VCSELs are also useful for driving up-converters to produce red, green, and blue light sources. By making the RLCEDs and VCSELs with very small device sizes, a large number of devices can be simultaneously produced on as common substrate using low cost semiconductor processing. Disclosed devices can also be combined with epitaxial lift-off techniques, which could make the RCLEDs and VCSELs very low cost. The RCLEDs are especially attractive for this, since they can use low Al content in their n-type layers and mirrors to ease the lift off. This could make them useful for ultrathin displays, and/or curved displays. VCSELs may also be used this way.

The display can be comprised of a thin screen that can contain the up-converters and RCLEDs or VCSELs, and the electrical interconnection of the pixels. Matrix addressing can be used to interconnect the pixels, based on lumenescence decay times of the up-converters. In addition, the display may include the electronic circuitry to receive a video display signal, and convert it to electrical driver signals for the RCLEDs or VCSELs to excite the up-converters and display an image. In such a display the up-converters that emit the red, green, or blue light could be placed in their own small cavities. These can be metal coated, with Ag for example, for high output coupling and optical isolation. Other metals can also be used an may have advantages in cost or thin film material properties. These up-converter cavities may be 25 µm to 300 µm or more in lateral size, depending on the display and pixel resolution. The minimum size can be smaller than 25 µm, and set mainly by the up-converter particle size and RCLED or VCSEL size. The RCLEDs or VCSELs infrared light emission can be efficiently coupled to the up-converter cavity through a small aperture, so that once trapped, the infrared light emission is efficiently absorbed by the up-converters. By placing the up-converters in their own cavities, the pixels can be isolated. This can lead to very high quality red, green, and blue pixels in a display that may only be a few hundred microns thick, and/or with a curved screen.

If the conducting channel 131 and DHCBR 126(a) are defined in lateral size to be elliptical, or at least non cylindrical, the polarization of the light source such as a VCSEL may also be controlled. This polarization control can arise due to preferred reflectivity by the Bragg reflectors, favoring lower loss for one polarization vs. another. However, other mechanisms may also control the polarization. Controlling the polarization can be used to make improved sensors. This is because the cavity size can be made so small using the DHCBR and conducting channel that only one spatial lasing mode may be allowed with within the gain bandwidth of the active material. This gain bandwidth may include spectral shifts due to temperature changes, as well as electronic band-filling. Elliptical or non cylindrical lateral confinement can then be used to control polarization.

The ability to make the cavity very small and control the polarization can lead to VCSEL sources capable of making improved sensors, especially those using Doppler sensing as well as atomic clocks. These sensors include housings that comprise the electronic circuitry and photonic components to direct light beams from the small lasers, and detect difference in the reflections of the light beams to perform sensing. Or, the VCSELs are used to excite rare earth atoms, by properly modulating the VCSEL output to create resonant optical drive conditions with the atoms. In these sensors the electronic circuitry and sensor performance depends on the single mode qualities of the VCSEL. Therefore these sensors can be improved by highly single mode, polarization controlled VCSELs that can be fabricated by reducing the size and controlling the shape of the conducting channel 131.

Figure 2:
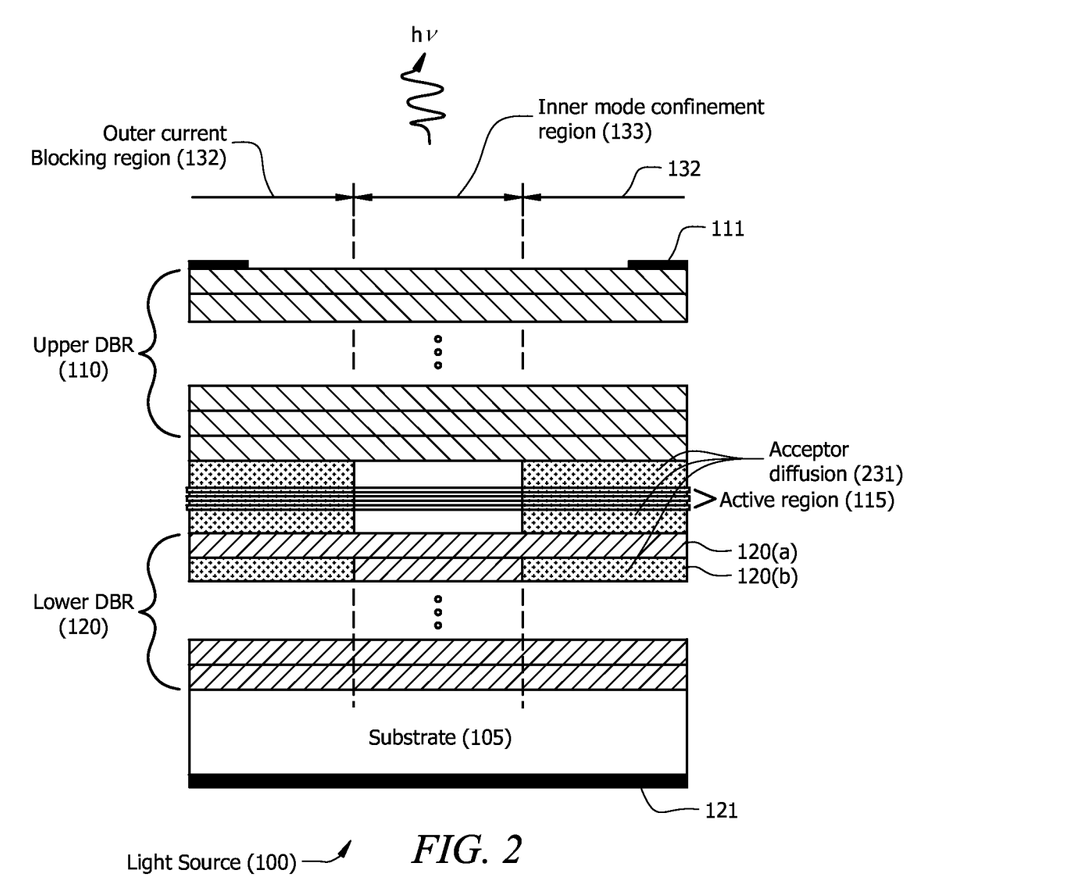
FIG. 2 is a schematic cross sectional diagram of a semiconductor vertical cavity diode light source that includes a selective diffusion that forms a reversed biased n-p junction in an outer current blocking layer which provides electrical and optical confinement through an active layer and into alternating layers of different material compositions in the upper or lower minors, according to an example embodiment.

FIG. 2 is a schematic cross sectional diagram of a disclosed semiconductor vertical cavity diode light source 200 that provides optical and electrical confinement through a selective diffusion that forms a reversed biased n-p junction in an outer current blocking layer of outer current blocking region 132 through the active layer and into alternating layers of different material compositions in the upper or lower minors, according to an example embodiment. The different material compositions either allow or prevent the dopant from incorporating in the layer, and increase the voltage to limit current flow in the inner mode confinement region 133. The buried acceptor diffusion may be performed in a two-step growth process, where the buried acceptor diffusion is performed after an initial growth step and lithographic patterning, followed by a second growth step to complete the upper DBR 110.

The structure of light source 200 is analogous to light source 100 shown in FIG. 1A except the blocking structure provided by the selective diffusion comprises a selective acceptor diffusion into regions acceptor impurity diffusion region 231 and layer 120(a) which is applied to the outer current blocking region 132 in active region 115 and one or more periods above or below active region 115. Since lower DBR 120 is shown as a n-type DBR such as an n-type AlAs/GaAs DBR, acceptor impurity diffusion 231 being into an n-type DBR 120 forms a reverse biased (upon normal operation of light source 200) p-n junction blocking layer comprising an n-type layer (e.g., AlAs layer) 120(a) that stays n-type after receiving the acceptor impurity-diffusion, while the other n-type layer (e.g., GaAs layer) 120(b) gets converted to p-type after receiving the acceptor impurity-diffusion.

In light source 200 the acceptor diffusion can be performed outside the inner mode confinement region 133 and diffused through the active region 115, n-type layer 120(a), and into one or more layers 120(b). Diffusion conditions can be fixed to obtain substantially different solubilities for the acceptor diffusion in layers 120(a) and 120(b) to form a n-p junction between these layers. For example, diffusion of Be (an acceptor) at temperatures less than about 615° C. can cause the Be to pass through layer 120(a), which in one embodiment may be AlAs, with little substitutional incorporation into the semiconductor crystal lattice, leaving layer 120(a) n-type. The Be substitutional incorporation into layer 120(b), which in one embodiment may be GaAs can at the same time be sufficient to convert this layer to p-type conductivity, forming a reverse bias p-n blocking junction to electrical current during normal operation of light source 200.

Layer 120(a), for example, can be formed from n-type AlAs or n-type InGaP doped with donor impurities at a concentration of $1 \times 10^{17}$ cm$^{-3}$ or higher, for which the transfer of Be (or other acceptor) impurity to substitutional lattice sites can be made to be minimal. Layer 120(b) can be formed from GaAs, which prior to the acceptor diffusion can be n-type but can be converted to p-type due to the Be diffusion and ease of the Be transferring to substitutional positions on the GaAs lattice. Other acceptor impurities, such as those found in the column II of the periodic table of elements, can also be used, such as Mg, Zn, or Cd. If intermixing is achieved in the active region 115 in the outer current blocking regions 132, additional mode confinement can be obtained through refractive index change due to the layer intermixing, and electrical confinement can be obtained due to an energy gap change resulting from the layer intermixing. The acceptor diffusion may be obtained from an implanted source, a source diffused from layers epitaxially grown on the surface and removed prior to a second epitaxial regrowth, or from the surface of the upper DBR 110.

It is also possible that the acceptor diffusion into the lower n-type minor form one or more DHCBRs. This can occur when the diffusion and doping conditions are such that a very light hole concentration is formed in one layer that is depletable by the second layer. This can happen for example for n-type GaAs/AlAs layers, for which the n-type AlAs is doped lightly to n-type, and diffusion conditions drive most of the acceptor out of the AlAs except a small remaining fraction converting the AlAs to p-type. N-type GaAs/AlGaAs layers may also achieve this.

The mode confinement arrangements shown in FIGS. 1A and 2 can be combined to provide even greater electrical confinement to the inner mode confinement region 133. In the case the inner mode confinement region 133 includes a mesa, the electrical current can then be confined to the phase-shifting mesa even for a device with electrode placement that covers a much larger area than the phase-shifting, mode confining mesa. In this way the thickness of the additional layers outside the inner mode confinement region 133 to provide strong current blocking also can also function as optical alignment markers for additional lithography steps that follow the mesa and DBR formation.

Figure 3A:
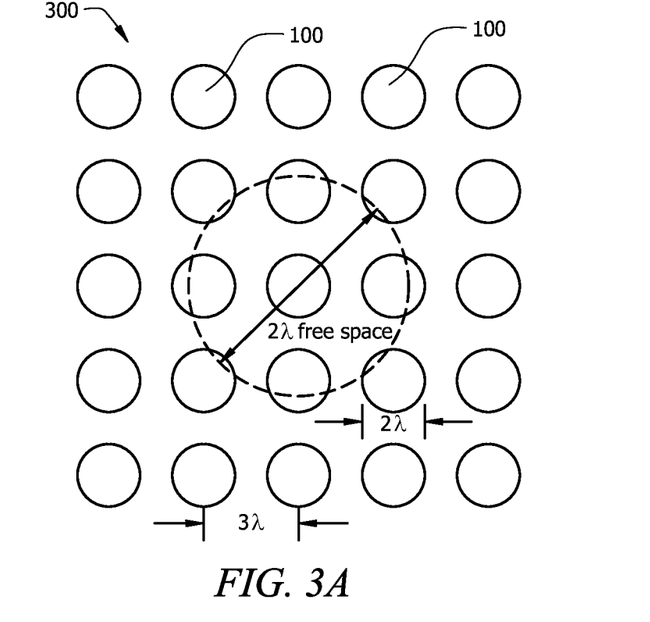
FIG. 3A shows a depiction of a semiconductor light source comprising a dense 2-dimensional (2D) array of disclosed VCSELs that provides high beam quality, according to an example embodiment.
Figure 3B:
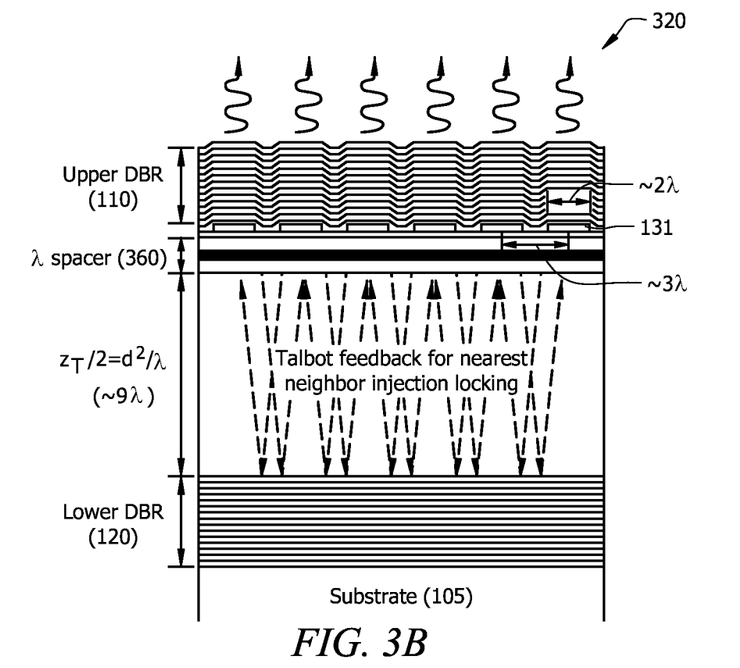
FIG. 3B is a cross sectional depiction of a semiconductor light source comprising the array of VCSELs shown in FIG. 3A that demonstrates how disclosed mode confinement can enable dense packing together with a cavity that internally sets the Talbot condition for in-phase lasing, according to an example embodiment.
Figure 3C:
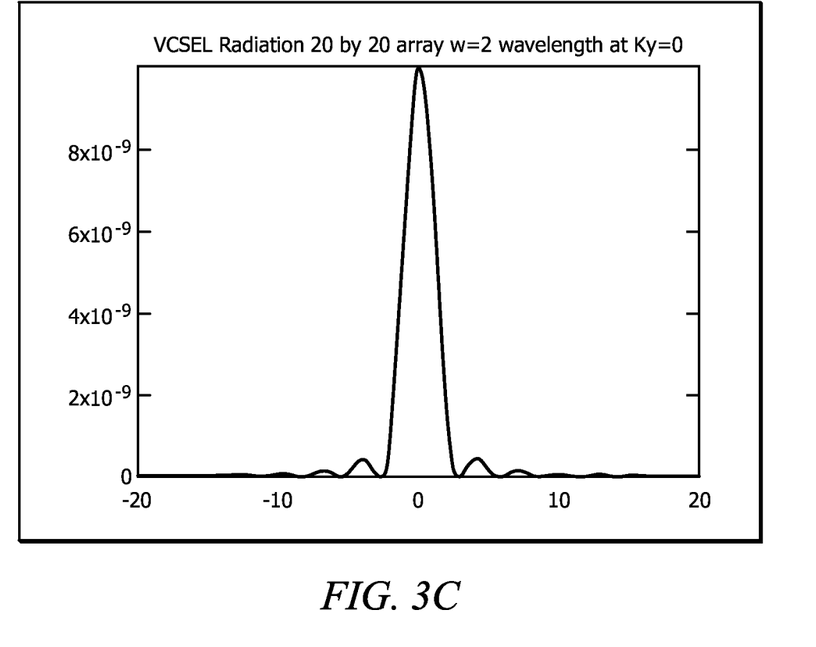
FIG. 3C depicts a single lobed angular radiation pattern created by the semiconductor vertical cavity diode light source shown in FIG. 3B.

FIGS. 3A-C show how disclosed light sources can be densely packed in a 2-dimensional array and phase coupled to one another by use of a properly designed phase shifting epitaxial layer added to the optical cavity. One arrangement to achieve proper phasing is through what is known in the art as Talbot coupling by including a "Talbot cavity". A Talbot cavity is an external cavity used for the coherent combining of the output from multiple laser diodes arranged in an array. A Talbot cavity is typically constructed with a single mirror placed at ½ the Talbot distance ($Z_T$) from the output facet of the laser array. This arrangement images the near field image of the array back onto the array itself at the Talbot distance, creating optical feedback, which forces all the lasers in the array to mode lock to obtain in-phase coupling.

FIG. 3A shows a depiction of a semiconductor light source 300 comprising a dense 2-dimensional (2D) array of disclosed light sources 100 that provides high beam quality. The circular structures correspond to the inner mode confinement region (emitter) 133 of each light source 100, with the white region corresponding to the outer current blocking region 132. Light sources 100 are shown packed denser than 2× the free space wavelength (2λ free space) based on the recognition that to obtain a single lobe radiation pattern for the array more than one emitter needs to be in an area equal to 2λ free space. As shown, each light sources 100 is <2λ free space in diameter, with the center-to-center spacing between emitters 133 of the light sources 100 in the 2D pattern is shown as 3λ (solid state optical wavelengths) center-to-center (equal to <λ free space for a crystal $n_f$ of ≥3.5).

FIG. 3B is a cross sectional depiction of a top emitting semiconductor light source 320 comprising the 2D array of light sources 100 shown in FIG. 3A that demonstrates how disclosed mode confinement can enable dense packing together with a cavity that internally sets the Talbot condition for in-phase lasing. The Talbot distance $Z_T/2$ is shown between the lower DBR 120 and the λ spacer layer 360. "d" shown in FIG. 3B represents separation of 3λ (in crystal) center to center of the emitters of neighboring light sources. The active region 115 in FIG. 1A is not shown in FIG. 3B, but would generally be present in the λ spacer layer 360. An appropriate extension layer in general will include a Talbot distance $Z_T$ that also includes penetration into the DBR mirror. The precise thickness of the region shown as the Talbot distance $Z_T$ should also account for this DBR penetration.

FIG. 3C depicts a single lobed angular radiation pattern that can be created by the semiconductor light source 320 shown in FIG. 3B for a 20 by 20 array of disclosed light sources. This embodiment recognizes that when the packing density of disclosed light sources exceeds 2λ free space, the radiation pattern provided by the array of light sources becomes single lobed. In this way a single large area mode can be obtained from an array of light sources such as VCSELs that can have improved modal properties and beam characteristics as compared to a large area VCSEL having a single mesa.

Figure 4A:
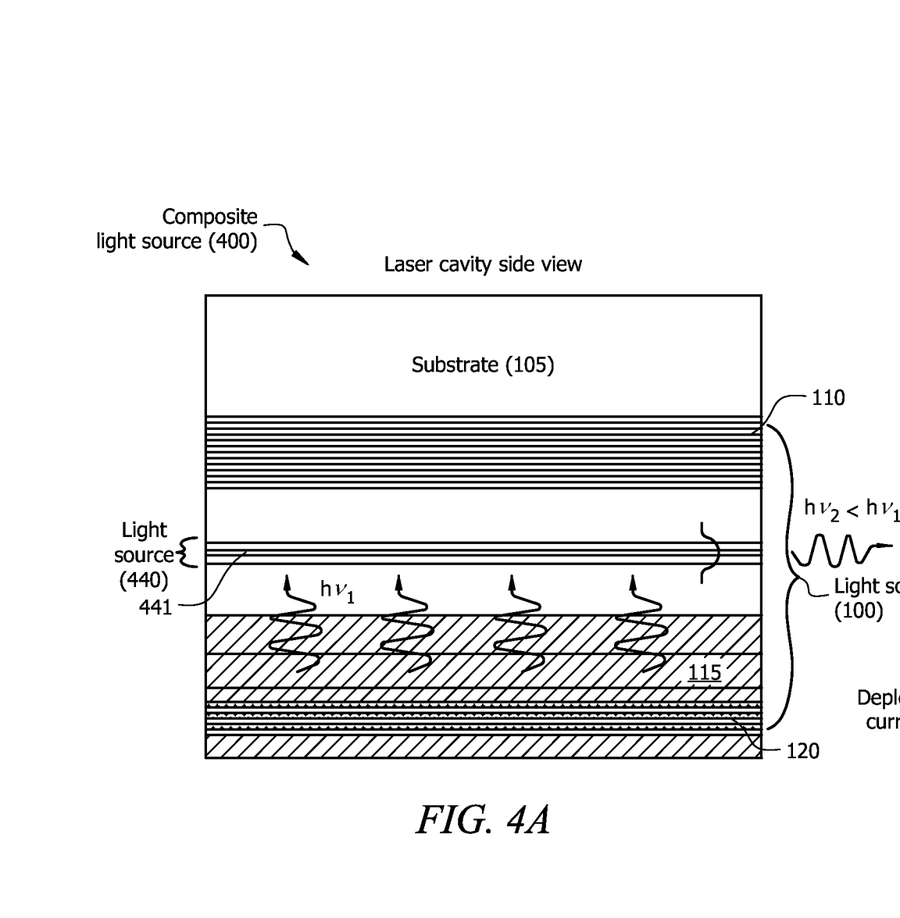
FIGS. 4A and 4B are a side view and end view, respectively, of an example composite light source that integrates a vertical cavity light source with a lateral cavity light source (minors not shown) that provides edge emission by embedding the lateral cavity layers inside a light source, according to an example embodiment.
Figure 4B:
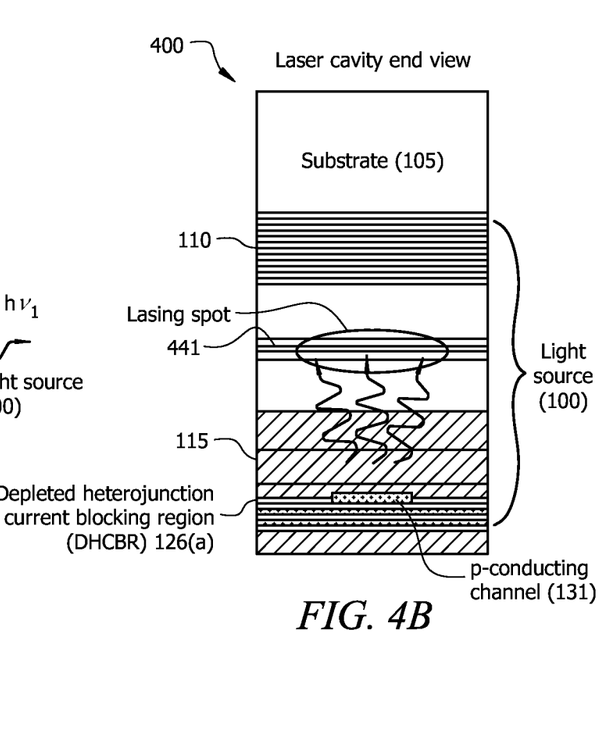

FIGS. 4A and 4B show a side view and end view respectively, of an example composite light source 400 that integrates a disclosed vertical light source 100 together with a lateral light source 440 (mirrors not shown) that provides edge emission formed by embedding lateral light source 440 within the vertical resonant cavity of light source 100. The DHCBR 126(a) together with conducting channel 131 provides mode confinement for the vertical cavity light source 100 During operation, vertical spontaneous emission generated by the light source 100 in region 115 at photon energy $hv_1$ is absorbed in the waveguide and/or active region 441 of lateral light source 440 to provide optical pumping to generate laser light at photon energy $hv_2$. The condition for absorption of vertical cavity light is that $hv_2 < hv_1$. In addition it is an advantage to also have absorption in adjoining layers to the active region (the waveguide) that can then transport their carriers to the active region of lateral light source 440.

Active region 441 may then include one or more light emitting regions emitting at $hv_2$ or within some spectral range of this energy, and absorbing layers to absorb light at $hv_1$. By using the vertical spontaneous emission from active region 115 to pump the active region 441, dopants can be removed the active region 441, and from the cladding layers surrounding active region 441. In this way heat generation that would otherwise come from electrons and holes and their free carrier absorption that accompany these dopants, or from free carrier absorption by electrons and holes that are otherwise injected and provide electrical transport from an external applied bias, can be reduced or eliminated, and optical loss due to absorption by free carriers can be reduced. By designing the layers of active region 441 to both provide a low threshold for lasing and sufficiently high potential barriers in the absorbing layers of active region 441 to keep electron and hole concentrations low in these absorbing regions, very low internal optical loss can be achieved in composite light source 400 for its own emission of light at photon energy $hv_2$.

In addition, the vertical cavity light source 100 may be doped heavily and be operated to produce a low drive voltage to the composite light source 400 of FIG. 4A/4B by making the active region 115 a bulk emitter of high efficiency, and driving the active region 115 with a sufficiently low drive voltage, the vertical cavity light source can be made to absorb heat in its active region 115. The amount of heat that can be absorbed depends on the thickness of active region 115, internal quantum efficiency, injection efficiency into the active region 115, and the bias voltage. In practice the active region 115 may be a few thousand angstroms in thickness to several microns. Active region 115 is therefore able to operate under some conditions as a heat pump, and absorb some its own heat from surrounding electrical contacting material and light source 400.

Lateral cavity optical loss can thus be reduced by removing p and n doping from the lateral cavity of the lateral light source 440, and having light source 100 driving it optically to excite lasing. Efficiency can be increased by using a sufficiently thick vertical emitting region that may range from 0.1 μm to 5 μm or more in thickness, to enable a low drive voltage across the p-n junction of emitting active 115 of the vertical cavity light source 100. To further reduce the drive voltage and overcome charge transport limitations in the vertical spontaneous emitter, multiple emitting regions may be cascaded using tunnel junctions. By reducing electrical currents efficiency may be improved due to the larger fraction of voltage drop that occurs over the active region 115 of light source 100. Vertical pumping in composite light source 400 enables the drive voltage to be reduced to very small values including values less than the photon energy divided by the unit electron change q, or $hv_2/q$, and yet produce optical gain in the lateral cavity emitter if this lateral cavity emitter is a laser. Likewise it can produce gain if this lateral cavity emitter comprises a superluminescent diode.

Under the condition that the drive voltage of each separate spontaneous emitter region is less than its own photon energy $hv_1/q$, the spontaneous emitter can be made to absorb heat generated by the laser. In this manner the spontaneous emitter not only serves to increase the efficiency of the laser by removing heat generating free carriers that would be associated with doping the laser, but can further increase the overall efficiency by converting some heat back into pump emission of the spontaneous emitter. By removing the free carriers and reducing the optical absorption, the lateral cavity laser can also be made to have a longer cavity without suffering significant optical absorption of its laser light, and thus its power output increased.

To increase the absorption efficiency of the active region 441 of the lateral light source 440 in absorbing the vertical emission of active region 115, a second minor (not shown) can be placed between the spontaneous emitter in active region 115 and the active region 441 to increase resonant absorption through field interference. In combination or separately, the active region 441 of the lateral light source 440 may be made to capture lateral emission from active region 115 through coupled lateral waveguides. By maintaining the voltage bias of active region 115 to cause absorption of its own spontaneous emission, photon recycling can be generated to further increase the pump efficiency of the lateral cavity laser by the spontaneous emitting active region 115.

In addition, the minor 110 shown in FIGS. 4A and 4B may not be required. If sufficient absorption is obtained in the active region 441 so that it is nearly all absorbed in a single pass, the mirror 110 can be eliminated. In general, mirror 110 will reflect only a range of angles from the active region 115, so some light is always expected to pass. By properly choosing photon energies $hv_1$ and $hv_2$, however, nearly all light from light source 100 can be absorbed in active region 441 if the absorbing layers are thicker than ~1.5 μm. In practice thickness of 3 μm to 5 μm or more may be of interest for the active region and absorbing regions of active region 441.

The low voltage contacting to the vertical light source 100 shown in FIGS. 4A and 4B can be facilitated using the DHCBR 126(a) within the p-side mirror of light source 100. In this way high thermal conductivity and low drive voltage can be simultaneously obtained.

An important advantage of the composite light source 400 for the case that active region 441 forms a laser is that because the internal optical absorption of this laser can be reduced, its cavity length can be increased and greater power extracted from its aperture. Increasing this power from the aperture enables improved solid state and fiber laser sources.

For example, the composite light source 400 of FIG. 4A/4B can be connected to an active or passive fiber of a given diameter, so that the semiconductor laser aperture coupled to the fiber is limited in its own aperture. Because the semiconductor laser can operate with increased cavity length because of its decreased internal optical absorption, it can also operate with an increased power. This enables an increase in power from the fiber coupled to the semiconductor laser. If the fiber is an active fiber to form a fiber amplifier or fiber laser, the fiber amplifier or laser will also be capable of greater power.

If the fiber is connected to a fiber network comprised of additional semiconductor lasers, with the fiber outputs optically coupled to a single fiber, the same power laser can thus operate with fewer semiconductor lasers and fiber couplings. This can reduce the size of the fiber laser system for a given power level. Because semiconductor lasers such as composite light source 400 shown in FIGS. 4A and 4B can be made to operate with lower internal electrical and optical losses, they can also be made to operate more efficiently. Therefore the improved fiber laser can also be made to consume less power for a given power output, and operate more efficiently.

Active region 441 may also be designed to operate in a superluminescent regime to maintain a broad spectrum. In this case the optical pumping by active region 115 can help to distribute the pump excitation among more than one emitting region placed in 441. In particular, by forming multiple quantum dot active layers that themselves exhibit little optical absorption for each other and emit at slight different center wavelengths, a very broad emission spectrum source can be constructed. This source can be useful to make an improved instrument for optical coherence tomography.

Figure 5:
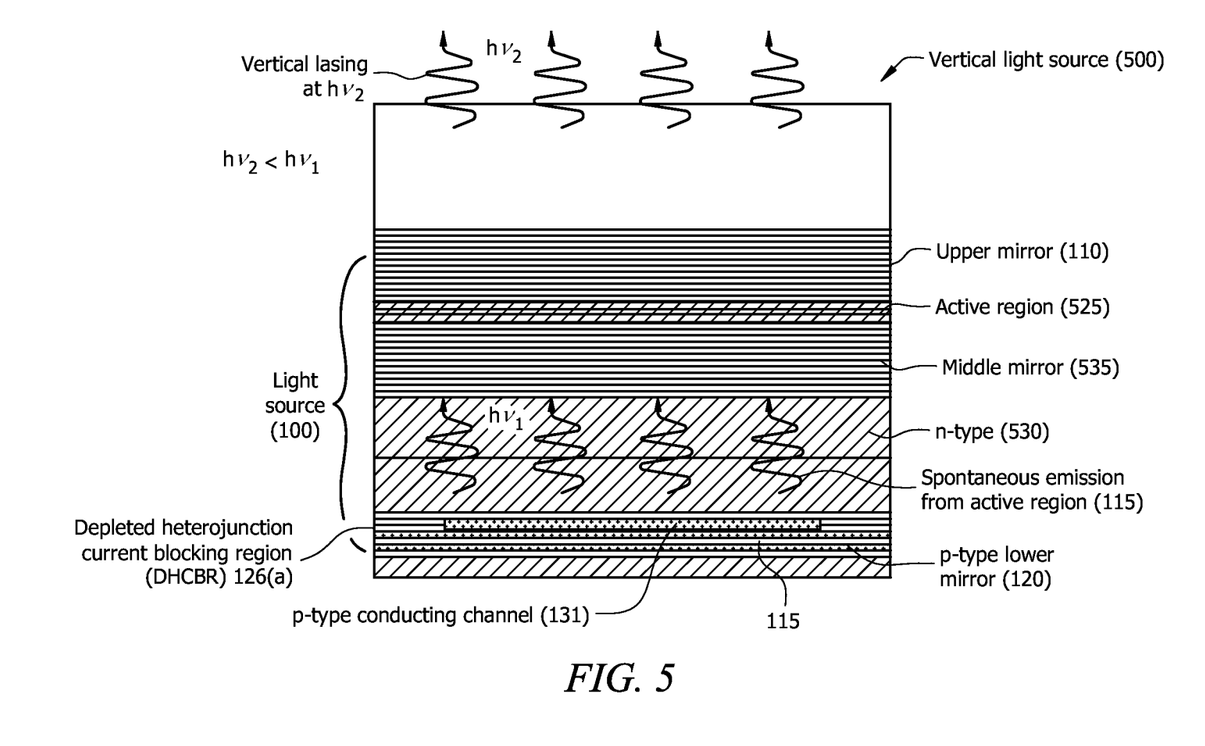
FIG. 5 shows an example composite light source that integrates a vertical cavity light source embodied as a spontaneous emitter with a vertical cavity light source that provides surface emission, according to an example embodiment.

FIG. 5 shows an example composite light source 500 that integrates a disclosed first vertical cavity light source providing a spontaneous emitter having an active region 115 formed between a p region provide by DBR minor 120 and n region 530, with a second vertical cavity light source having its active region 525 shown that provides surface emission, according to an example embodiment. In this embodiment the second vertical cavity light source having the active region shown as 525 can be a VCSEL, which partially shares a cavity with the vertical cavity light source 100 having active region 115. By optically pumping the light source 100 (e.g., a VCSEL) with active region 115, dopant impurities can be removed from the active region 525 of a second VCSEL to reduce free carrier absorption that causes heating and optical loss.

In this embodiment the middle minor 535 shown forms a reflector for the VCSEL with active region 525, while effectively allowing light from active region 115 of light source 100 to pass through the middle mirror 535 and be absorbed in active region 525. This middle minor 535 can be designed to have two reflectivity bands by choosing its layer thicknesses based on multiples of the two center wavelengths. One of the reflectivity bands can be used to reflect the light from active region 515 with sufficient value to lase as a VCSEL, and a second reflectivity band that is used to cause resonant absorption of the spontaneous emission from active region 115. Likewise, the upper DBR 110 can also be made to have two reflectivity bands, one of which forms a VCSEL with active region 525, and one of which causes resonant absorption of the spontaneous emission from active region 115. The lower DBR 120 or other minor can then be designed to have a reflectivity band only for emission from active region 115.

As with the case of the light source embodiment of FIG. 4A/4B, in the case of the light source embodiment of FIG. 5 the deleterious effects of free carrier absorption causing heat generation and light absorption can be reduced by optical pumping, and heating due to electrical transport eliminated for the second VCSEL. In addition, multiple active regions can be added to the VCSEL that are resonant with its vertical lasing mode, so that its optical gain is increased and its cavity requirements for lasing reduced. Optical pumping can also produce more uniform lasing for large VCSEL areas. In addition, mesas can be added to the VCSEL with active region 515 and cavity extensions used to form phase coupling feedback, including Talbot feedback as described above for FIGS. 3A-C. Each of these can enable more desirable cavity conditions to be reached for high efficiency in lasing from their active region.

As described above, disclosed light sources include a robust form of a low cost laser or other light source by incorporating lithographic control of the optical mode that also produces polarization control, and forces current through an optimum electrical injection path. It forces the current through the injection path while also enabling easy heat flow through the device to reduce thermal resistance. Disclosed embodiments also enable low voltage operation and improved optical performance from semiconductor laser diodes. Low operating voltage is important to interface to Si CMOS drivers and detector chips.

Disclosed light sources have applications in visible light emitters, high speed optical interconnects, optical sensing, displays, and optical pumping. Sensor uses for disclosed embodiments include position sensors, gas sensors, bio-sensors, and time keeping (atomic clocks).

EXAMPLES

Disclosed embodiments are further illustrated by the following specific Examples, which should not be construed as limiting the scope or content of this Disclosure in any way.

Figure 6:
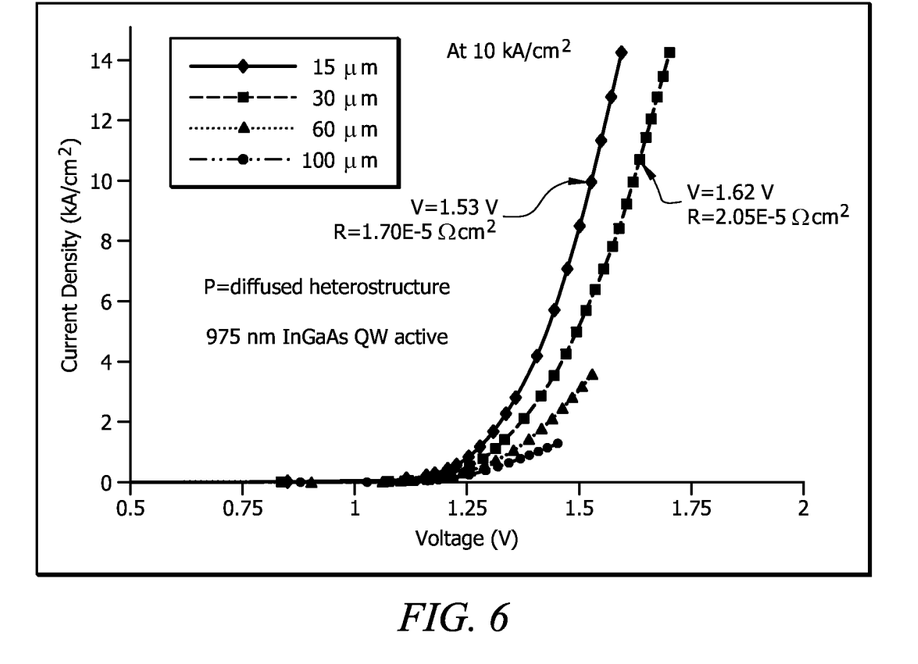
FIG. 6 shows measured data for an example InGaAs quantum well p-n diode laser, according to an example embodiment of the current density vs. voltage, for a variety of geometries from 15 μm to 100 μm.

FIG. 6 shows measured data for an example InGaAs quantum well p-n diode laser of the current density vs. voltage, for a variety of geometries from 15 μm to 100 μm (emitter size). The test laser included disclosed depleted heterojunctions for current confinement, with a selective p-diffusion (Be acceptors) to form the conducting channel. When corrected for external resistance, a drive voltage of 1.49 V was found for a current density of $10^4$ A/cm$^2$.

FIG. 6 shows electrical data taken on the current-voltage characteristics of an InGaAs quantum well light source fabricated using the DHCBR 126(a) and p-diffusion conducting channel 131 shown in FIG. 1A. The DHCBR 126(a) included an 650 Å thick $Al_{0.45}Ga_{0.55}As$ undoped layer clad on its lower side by p-type $Al_{0.1}Ga_{0.9}As$ and on its upper side by p-type GaAs. Some undoped graded interfaces are also included to reduce the electrical resistance of the p-diffused conducting channel.

After an initial growth, the wafer was patterned lithographically and with selective etching to form mesas containing Be acceptor impurities intended for diffusion. After the wafer was returned to the epitaxial growth chamber following mesa fabrication, Be was diffused from the mesas in the growth chamber just prior to a second growth. The second growth was either a GaAs test structure to isolate the voltage-current characteristics of the DHCBR and conducting channel, as used here, or a mirror to complete an RCLED or a VCSEL. The test structure allows the isolation of the electrical properties of the DHCBR and p-conducting channel. The measured current density vs. voltage shown in FIG. 6 for the test structure includes a three quantum well InGaAs emitting region centered at 980 nm wavelength, the p-diffused region that shows that the voltage is 1.53 V for a current density of $10^4$ A/cm$^2$ for the 15 μm diameter device. When series resistance to the device is accounted for, the actual device voltage is 1.49 V for a current density of $10^4$ A/cm$^2$ in the 15 μm diameter mesa test device. The blocking voltage was 3.5 V for the outer current blocking region 132 that includes the DHCBR 126(a) for these devices.

A significant aspect of these measurements is that very small devices are expected to produce the smallest drive voltages for high excitation levels of the active region. This is because additional electrical resistances above and below the conducting channel region 131 can be minimized by making small devices of ~5 µm or less. A feature of this scaling can be seen in the current density vs. voltage curves of FIG. 6. As the device size reduces, the voltage required to create this current density decreases. This is because spreading resistance to the device active region more favorably decreases the voltage, and because the drive current for a given current density decreases. These small sizes can minimize spreading resistances, so that drive voltage is mainly due to the active region (e.g., p-n quantum well emitter) and conducting channel 131. The results show that the p-diffused channel can provide a very low drive voltage to the active region of three quantum wells. For a VCSEL the very low drive voltage can produce high efficiency as well as enable high speed modulation for optical data generation. Since the low drive voltage can be achieved in very small devices, it can also be used to make high efficiency displays using RCLEDs or VCSELs.

Figure 7A:
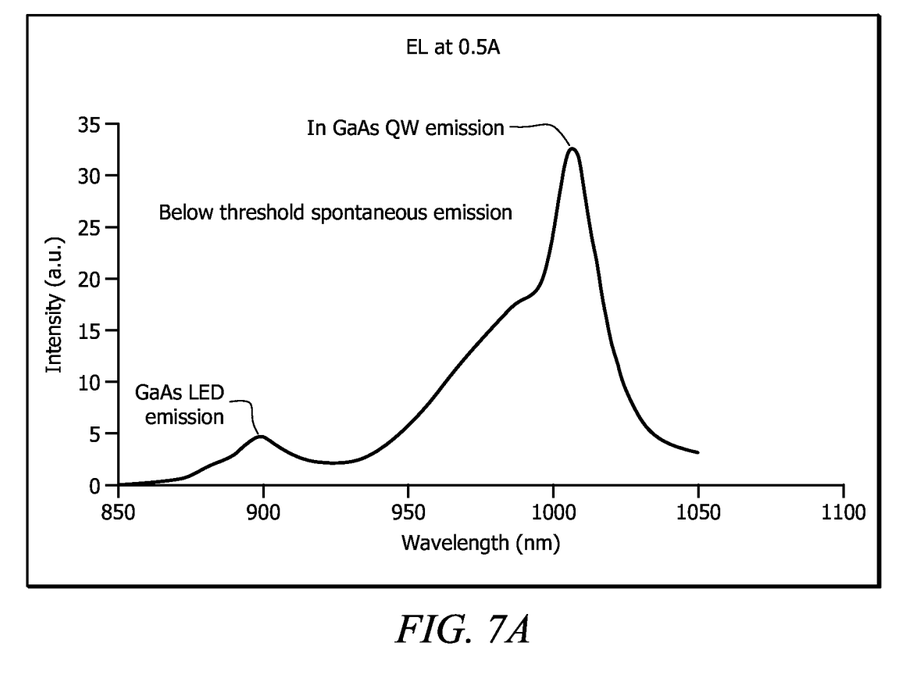
FIGS. 7A and 7B show spontaneous emission spectra and lasing spectra for the laser described relative to FIG. 6 pumped by an light emitting diode (LED).
Figure 7B:
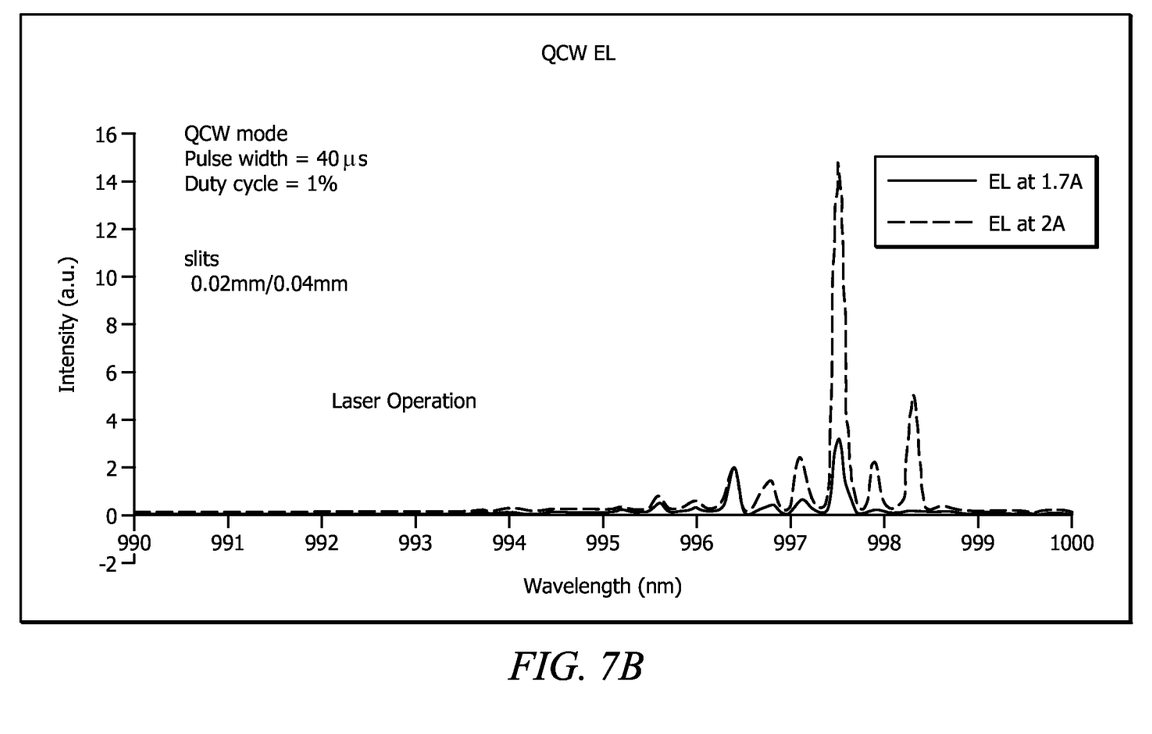

FIGS. 7A and 7B show spontaneous emission spectra and lasing spectra for the composite light source 400 of FIG. 4A/4B utilizing a vertical cavity spontaneous emitter to optically pump a lateral cavity laser. More recent laboratory demonstrations have also used the DHCBR to obtain electrical confinement in the lower mirror 120. For the data shown in FIG. 7, the composite semiconductor light source included an undoped 1.5 µm thick GaAs spontaneous emitting region between a p and n $Al_{0.1}Ga_{0.9}As$ layers. The p-layer included an $Al_{0.7}Ga_{0.3}As$ reflector and Ag metal minor and electrical contact. The light emission from the GaAs spontaneous emitting active region 115 is at wavelength ~875 nm. The GaAs spontaneous emitter excites a GaAs region of the laser containing a InGaAs single quantum well, and emits at ~990 nm. The GaAs region of the laser was 0.4 µm thick. The upper DBR mirror 110 was formed from 16 pairs of AlAs and $Al_{0.1}Ga_{0.9}As$ layers, each having an optical quarter wave thickness relative to the 875 nm emission of the light source provided by active region 115. The AlAs layers in particular also produced large critical angles to increase the capture of wide angular emission from the GaAs spontaneous emitter by the laser having active region 441.

The laser cavity is 100 µm wide and 0.5 cm long, which is also the cross sectional area of the GaAs spontaneous emitter. In FIG. 7A is shown the spontaneous emission that is composed of GaAs emission roughly around 875 nm emission, and emission of the InGaAs quantum well that was optically pumped by the GaAs spontaneous emitter. The InGaAs quantum well emits at ~980 nm. FIG. 7B shows the emission at higher electrical driver level to the GaAs spontaneous active region 115, causing lasing in the InGaAs quantum well in region 441. The laser emission is at ~990 nm.

While various disclosed embodiments have been described above, it should be understood that they have been presented by way of example only, and not limitation. Numerous changes to the subject matter disclosed herein can be made in accordance with this Disclosure without departing from the spirit or scope of this Disclosure. In addition, while a particular feature may have been disclosed with respect to only one of several implementations, such feature may be combined with one or more other features of the other implementations as may be desired and advantageous for any given or particular application.

Thus, the breadth and scope of the subject matter provided in this Disclosure should not be limited by any of the above explicitly described embodiments. Rather, the scope of this Disclosure should be defined in accordance with the following claims and their equivalents.

The terminology used herein is for the purpose of describing particular embodiments only and is not intended to be limiting. As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which embodiments of the invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

We claim:

1. A semiconductor vertical resonant cavity light source, comprising:
   an upper mirror and a lower mirror that define a vertical resonant cavity;
   a first active region within said vertical resonant cavity for light generation between said upper mirror and said lower mirror;
   said vertical resonant cavity including an inner mode confinement region and an outer current blocking region;
   a depleted heterojunction current blocking region (DHCBR) within said outer current blocking region of at least one of said upper minor, said lower minor, and said first active region, and
   a conducting channel within said inner mode confinement region that physically contacts and is framed by said DHCBR, wherein said DHCBR forces current flow into said conducting channel during operation of said vertical light source.

2. The vertical light source of claim 1, wherein said conducting channel comprises a selective p-type diffusion which converts an inner portion of said DHCBR to said conducting channel.

3. The vertical light source of claim 1, wherein said upper minor comprises a p-type distributed Bragg reflector (DBR) and said lower minor comprises an n-type DBR.

4. The vertical light source of claim 3, wherein at least one period of said p-type DBR or said n-type DBR includes a mesa in said conducting channel that is within two optical wavelengths distance to said first active region, said mesa being 5 Å to 300 Å in height.

5. The vertical light source of claim 4, wherein a packing density of said array of said vertical light sources exceeds two free space λ's for said vertical light sources.

6. The vertical light source of claim 1, wherein a more lightly doped side of said DHCBR has a maximum p-type concentration of $1 \times 10^{17}$ $cm^{-3}$, and wherein said conducting channel has a minimum p-type concentration of at least $1 \times 10^{17}$ $cm^{-3}$.

7. The vertical light source of claim 1, wherein a more lightly doped side of said DHCBR has a maximum p-type concentration of $1 \times 10^{16}$ $cm^{-3}$, and wherein said conducting channel has a minimum p-type concentration of at least $5 \times 10^{17}$ $cm^{-3}$.

8. The vertical light source of claim 1, wherein said vertical light source comprises a 2 dimensional array of said vertical light sources, further comprising a λ spacer layer in said vertical resonant cavity sized to provide constructive feedback for phase coupling nearest neighbors of said array of said vertical light sources so that said 2 dimensional array of said vertical light sources collectively provide a single lobed angular radiation pattern.

\* \* \* \* \*